United States Patent
Tomiuchi et al.

(10) Patent No.: US 6,653,778 B1
(45) Date of Patent: Nov. 25, 2003

(54) FLUORESCENT COLOR CONVERSION FILM, FLUORESCENT COLOR CONVERSION FILTER USING THE CONVERSION FILM, AND ORGANIC LIGHT-EMITTING DEVICE EQUIPPED WITH THE CONVERSION FILTER

(75) Inventors: Yoshimasa Tomiuchi, Kanagawa (JP); Yotaro Shiraishi, Kanagawa (JP)

(73) Assignee: Fuji Electric Co., LTD., Kawasaki (JP)

( * ) Notice: Subject to any disclaimer, the term of this patent is extended or adjusted under 35 U.S.C. 154(b) by 121 days.

(21) Appl. No.: 09/667,094

(22) Filed: Sep. 21, 2000

(30) Foreign Application Priority Data

Sep. 24, 1999 (JP) .............................. 11-271298

(51) Int. Cl.[7] .................................. H01J 1/62
(52) U.S. Cl. ................. 313/501; 313/110; 313/504
(58) Field of Search .................. 313/504, 506, 313/501, 110

(56) References Cited

U.S. PATENT DOCUMENTS

| | | | | |
|---|---|---|---|---|
| 5,294,870 A | * | 3/1994 | Tang et al. | 313/504 |
| 5,717,289 A | * | 2/1998 | Tanaka | 313/503 |
| 5,869,929 A | * | 2/1999 | Eida et al. | 313/461 |
| 5,949,188 A | * | 9/1999 | Leising et al. | 313/500 |
| 6,013,982 A | * | 1/2000 | Thompson et al. | 313/506 |
| 6,221,517 B1 | * | 4/2001 | Eida et al. | 250/483.1 |

FOREIGN PATENT DOCUMENTS

| | | |
|---|---|---|
| EP | 0387715 | 9/1990 |
| JP | 57-157487 | 9/1982 |
| JP | 58-147989 | 9/1983 |
| JP | 1-315988 | 12/1989 |
| JP | 2-273496 | 11/1990 |
| JP | 3-152897 | 6/1991 |
| JP | 3-194895 | 8/1991 |
| JP | 3-212602 A1 | 9/1991 |
| JP | 3-214593 | 9/1991 |
| JP | 5-198921 | 8/1993 |
| JP | 5-258860 | 10/1993 |
| JP | 8-286033 A1 | 11/1996 |
| JP | 408286033 A | * 11/1996 ............. G02B/5/22 |
| JP | 9-106888 | 4/1997 |
| JP | 9-115668 | 5/1997 |
| JP | 09115668 | 5/1997 |
| JP | 9-208944 | 8/1997 |
| JP | 11-61112 | 3/1999 |
| JP | 11-209751 | 8/1999 |

OTHER PUBLICATIONS

D. A. Gromov et al., *J. Opt. Soc. Am.* B/vol. 2, No. 7, Jul. 1985, pp. 1028–1031.

UK Search Report, Appln. No. GB 0022380.0, Apr. 5, 2001.

* cited by examiner

*Primary Examiner*—Ashok Patel
*Assistant Examiner*—Glenn Zimmerman
(74) *Attorney, Agent, or Firm*—Darby & Darby

(57) ABSTRACT

A high boiling-point solvent, included in a fluorescent color conversion film, suppresses degradation in color conversion characteristic by compensating for a decrease in dielectric constant due to solidification of the matrix system. The fluorescent color conversion film of the present invention includes, in addition to the high boiling point solvent, organic fluorescent dyes, which absorb light in a near ultraviolet to visible light region and emit visible light of a different wavelength, and a matrix resin bearing the organic fluorescent dye. The high boiling point solvent has a boiling point of 150° C. or higher and a vapor pressure of 5 mmHg or lower at the temperature of 20° C. The fluorescent color conversion film is useful in a fluorescent color conversion filter, which itself is useful in light-emitting devices, such as self-emitting multi-colored- or full colored-displays, display panels and backlights.

8 Claims, 1 Drawing Sheet

FLUORESCENT COLOR CONVERSION FILM, FLUORESCENT COLOR CONVERSION FILTER USING THE CONVERSION FILM, AND ORGANIC LIGHT-EMITTING DEVICE EQUIPPED WITH THE CONVERSION FILTER

BACKGROUND OF THE INVENTION

The present invention relates to a fluorescent color conversion film that converts light emitted in near ultraviolet to visible region by a light-emitting element to light with different wavelength in the visible region. The invention also relates to a fluorescent color conversion filter employing such a fluorescent color conversion film. The invention further relates to an organic light-emitting device equipped with such a fluorescent color conversion filter. The fluorescent color conversion filter and the organic light-emitting device are suitably applied to both consumer-oriented and industry-used display apparatuses, such as a self-emitting multi-colored- or full colored-display, a display panel and a backlight.

With increasing demand for a flat panel display to replace a conventional CRT, development and practical application of various display devices are being actively conducted. An electroluminescent device (hereinafter referred to as a light-emitting device) is one of the devices to meet these needs. The light-emitting device has received great attention, as it is a self light-emitting device of full solid-state exhibiting such high resolution and high visibility that are not attained by other display devices.

In a conventional method for multi-colored or full-colored display of a light-emitting device for use in a flat panel display, light-emitting elements corresponding to three primary colors of red, blue and green are separately arranged in a matrix form and each of them is caused to emit each color of light, as disclosed by Japanese Unexamined Patent Application Publication Nos. S57-157487, S58-147989 and H3-214593. However, the color display using an organic light-emitting device requires precise arrangement of three kinds of light-emitting material for red, blue and green in a matrix form. The technology for the arrangement is difficult and the manufacture of such an arrangement is costly. In addition, the method has a problem that chromaticity gradually deviates because the lifetimes of the three light-emitting materials differ from each other.

In another known method for color display, white light emitted from a backlight is passed through color filters to obtain three primary colors, as disclosed by Japanese Unexamined Patent Application Publication Nos. H1-315988, H2-273496 and H3-194895. However, an organic white-light-emitting device exhibiting a long life and high brightness that are necessary to attain red, green and blue light of high brightness has not yet been obtained.

In another known method for color display, fluorescent elements separately arranged in a plane absorb light from a light-emitting element. Each of the fluorescent elements emits fluorescent light of different colors, as disclosed by Japanese Unexamined Patent Application Publication No. H3-152897. The method in which multi-colored fluorescent light is emitted from a light-emitting element using fluorescent elements is also applied to CRT and plasma display.

In recent years, a color conversion method has been developed in which fluorescent material is used as a filter. The material absorbs light in the region of an organic light-emitting element and emits fluorescent light in a visible light region, as disclosed by Japanese Unexamined Patent Application Publication Nos. H3-152897 and H5-258860. In this method, color of the light emitted from the organic light-emitting element is not limited to white light, which allows use of a brighter organic light-emitting element as a light source. In an example of a color conversion method using an organic light-emitting element emitting blue light, wave length conversion is performed from blue light to green or red light, as disclosed by Japanese Unexamined Patent Application Publication Nos. H3-152897, H8-286033 and H9-208944. A full-colored self-emitting display device could be constructed by precisely patterning a fluorescent color conversion film containing such an organic fluorescent dye, even when low energy rays such as radiation in a near ultraviolet to visible light region from an organic light-emitting element is utilized. The following two methods are among known methods for patterning a fluorescent color conversion film.

(1) Similar to the case of inorganic fluorescent material, organic fluorescent dye is dispersed in a liquid photoresist, which is a photo-reactive polymer, then, the resulting material is laminated by spin-coating, followed by patterning by means of photolithography, as disclosed by Japanese Unexamined Patent Application Publication Nos. H5-198921 and H5-258860.

(2) Fluorescent dye or fluorescent pigment is dispersed in a basic binder, then the resulting article is etched by acidic aqueous solution, as disclosed by Japanese Unexamined Patent Application Publication No. H9-208944.

It is commonly known that a dielectric constant of a material decreases with solidification of matrix of the material. For example, methyl methacrylate, which is a monomer, has a dielectric constant of 4.0, while poly(methyl methacrylate), in which solidification has progressed by polymerization, exhibits a lowered dielectric constant down to 2.9. Decrease in the dielectric constant due to solidification of the matrix alters the environmental condition of the organic fluorescent dye, and increases ion pair interaction of the organic fluorescent dye in a ground state or an excited state, resulting in a lower value of fluorescence quantum yield of the dye. When an organic solvent of high polarity, for example, ethyl alcohol, is added to this system, the dielectric constant of the system increases, and as a result, ion pair interaction of the organic fluorescent dye is suppressed. D. A. Gromov reported in J. Opt. Soc. Am. B/Vol. 2, No. 7, p. 1028 (1985). Addition of ethanol in Rhodamine 6G, a xanthene dye, makes an ion pair apart, which means that ion pair interaction decreases, resulting in improvement of the fluorescence quantum yield.

[Problem to Be Solved by the Invention]

In forming a fluorescent color conversion film using organic fluorescent dye dispersed in a liquid photoresist by means of photolithography process, there has been a problem that proportion of monomer decreases by polymerization due to optical or thermal curing of the resist. Furthermore, the organic solvent used evaporates. As a result, the dielectric constant of the system decreases, causing deterioration of color conversion characteristics (fluorescence quantum yield, in particular) of the fluorescent color conversion film.

OBJECTS AND SUMMARY OF THE INVENTION

It is an object of the present invention to provide a fluorescent color conversion film formed by a photolithography process that overcomes the foregoing problems.

It is a further object of the present invention to provide a fluorescent color conversion film formed by a photolithography process that suppresses degradation in color conversion characteristic by compensating for decrease in dielectric constant due to solidification of the system.

It is another object to provide a fluorescent color conversion filter employing such a fluorescent color conversion film.

It is still another object of the invention to provide an organic light-emitting device equipped with the fluorescent color conversion filter.

The first embodiment of the present invention is a fluorescent color conversion film comprising an organic fluorescent dye which absorbs light, emitted from a light-emitting element, in a near ultraviolet to visible light region, and emits visible light of different wavelength, a matrix resin bearing the organic fluorescent dye, and a high boiling point solvent having a boiling point of 150° C. or higher and a vapor pressure of 5 mmHg or lower at temperature of 20° C.

The second embodiment of the present invention is a fluorescent color conversion film as the first embodiment, wherein the high boiling point solvent is contained in an amount of 0.00001 to 50 weight % with respect to the weight of the fluorescent color conversion film.

The third aspect of embodiment of the present invention is a fluorescent color conversion filter comprising a fluorescent color conversion film as the first aspect of embodiment and a substrate.

The fourth aspect of embodiment of the present invention is a fluorescent color conversion filter as the third aspect of embodiment, wherein said high boiling point solvent is contained in an amount of 0.00001 to 50 weight % with respect to the weight of the fluorescent color conversion film.

The fifth aspect of embodiment of the present invention is an organic light-emitting device, comprising a fluorescent color conversion filter as third or fourth aspect of embodiment, and an organic light-emitting element.

There was a problem that a fluorescent quantum yield, which is one of color conversion characteristics of a fluorescent color conversion film, decreased when a system comprising organic fluorescent dye dispersed in liquid photoresist was optically or thermally cured. This decrease was a result of lowering of the dielectric constant of the system, which, in turn, was caused by decrease of monomers in the system due to polymerization. This decrease was also caused by evaporation of the organic solvent used in the system. The inventors have found that excellent color conversion characteristic holds when a high boiling point solvent, with boiling point of 150° C. or higher, is added to the system.

While not adhering to any specific theory, the effect can be considered to be brought about by the following reason. The high boiling point solvent contained in the system, which does not evaporate by heating at a fabrication process temperature of about 150° C., remains in the vicinity of the organic dye molecule. Hence, the lowering of dielectric constant of the matrix resin is prevented and the decrease of fluorescence quantum yield or quenching of fluorescence of the organic dye is suppressed.

The inventors have further found that a high boiling point solvent, having a substituent(s) of greater polarity, such as a hydroxyl group or a carbonyl group, further improves the color conversion characteristic.

The present invention has been accomplished based on the above-described findings. According to the invention, a fluorescent color conversion film of high color conversion efficiency is easily obtained by adding a high boiling point solvent, having a boiling point of 150° C. or higher and a vapor pressure of 5 mmHg or lower at 20° C., to a fluorescent color conversion film comprising an organic fluorescent dye and matrix resin bearing the organic fluorescent dye. Also, a fluorescent color conversion filter exhibiting high precision and high color conversion efficiency is readily obtained employing such a fluorescent color conversion film. An organic light-emitting device equipped with such a fluorescent color conversion filter is also obtained. Further, for obtaining an organic light-emitting device of a specified brightness, fluorescent color conversion filter with higher conversion efficiency according to the invention allows lower brightness of an organic light-emitting element, thus, lower driving voltage is enough to obtain the same brightness of the organic light-emitting device. The quantity of the additive high boiling point solvent is favorably controlled in the range of 0.00001 to 50 weight %, more preferably 0.00001 to 1 weight % in the fluorescent color conversion film, depending on the species of the solvent.

DETAILED DESCRIPTION OF THE INVENTION

1. Fluorescent Color Conversion Film

A) Organic Fluorescent Dye

Figure 1:
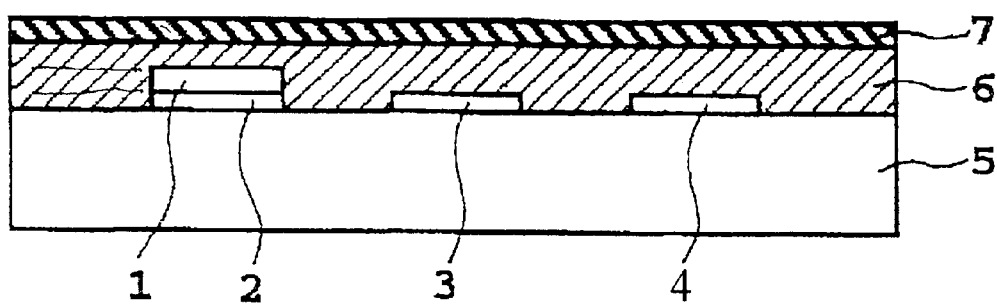
FIG. 1 is a schematic cross sectional view illustrating an embodiment of a fluorescent color conversion filter of the invention

Organic fluorescent dye used in the invention absorbs light in near ultraviolet to visible light region, in particular blue to blue-green region, and emits visible light with a different wavelength. Preferably used in the invention is one or more fluorescent dye that emits at least fluorescent light in red region absorbing light in blue to blue-green region. Combination with one or more fluorescent dye emitting green light may be applied if necessary.

Among organic light-emitting elements, blue to blue-green light emitting elements are readily obtained. When light from such an element is transmitted through a red filter and converted to light in red region, however, the transmitted light becomes dark and very weak output light because the light from such an element includes essentially very little red component. Therefore, red light of sufficient intensity can be obtained only when the light from such a light-emitting element is converted to light in red region by means of organic fluorescent dye. Light in green region may be obtained, as in the case of red light, by converting light from the light-emitting element by means of another organic fluorescent dye. Alternatively, green light can be obtained by simply transmitting through a green filter if the light from the organic light-emitting element contains enough component of light in green region. On the other hand, light in blue region with sufficient intensity can be obtained by simply transmitting the light from an organic light-emitting element through a blue filter.

Organic fluorescent dye to be used in the invention preferably exhibits sufficient capability of fluorescence. Such fluorescent dye becomes into a singlet excited state absorbing light from a light-emitting element, and desirably exhibits low probability of the process of intersystem crossing, relaxation via oscillation, and the like, so that favorably emits fluorescent light with high quantum yield.

The organic fluorescent dye which emits fluorescent light in red region absorbing light in a blue to blue-green region emitted from a light-emitting element may be selected from a rhodamine dye such as rhodamine B, rhodamine 6G, rhodamine 3B, rhodamine 101, rhodamine 110, sulforhodamine, basic violet 11, basic red 2; a pyridine dye such as 1-ethyl-2-[4-(p-dimethylaminophenyl)-1,3-butadienyl]-pyridinium-perchlorate (pyridine 1); a cyanine dye; or an oxadine dye. Besides, various dyestuffs such as direct dye, acid dye, basic dye or disperse dye may be used as far as it exhibits fluorescence.

The organic fluorescent dye which emits fluorescent light in a green region absorbing light in a blue to blue-green region emitted from a light-emitting element may be selected from a coumarin dye such as 3-(2'-benzothiazolyl)-7-diethylaminocoumarin (coumarin 6), 3-(2'-benzoimidazolyl)-7-N,N-diethylaminocoumarin (coumarin 7), 3-(2'-N-methylbenzoimidazolyl)-7-N,N-diethylaminocoumarin (coumarin 30), 2,3,5,6-1H,4H-tetrahydrb-8-trifluoromethylquinolidine(9,9a,1–gh) coumarin (coumarin 153); a dyestuff of coumarin dye species: basic yellow 5 1; and a naphthalimide dye such as solvent yellow 11 and solvent yellow 116. Besides, various dyestuffs such as direct dye, acid dye, basic dye or disperse dye may be used as far as it exhibits fluorescence.

The above-listed organic fluorescent dyes may be mixed by kneading with polymethacrylate, polyvinylchloride, vinylchloride-vinylacetate copolymer resin, alkyd resin, aromatic sulfonamide resin, urea resin, melamine resin, benzoguanamine resin, or mixture of these resins, obtaining an organic fluorescent pigment to be used in the invention. Any of these fluorescent dyes or pigments (for these two kinds of materials the term organic fluorescent dye is used in the specification) may be used alone or in combination of two or more species to control a hue of the fluorescent light.

Organic fluorescent dye in the invention is contained in the fluorescent color conversion film in an amount of 0.01 to 5 weight %, preferably 0.1 to 2 weight % with respect to the weight of the conversion film. If the content of the organic fluorescent dye is less than 0.01 weight %, wavelength conversion is performed insufficient. If the content is more than 5 weight %, lower efficiency of color conversion results due to the effect of concentration quenching.

2) Matrix Resin

A matrix resin used in the fluorescent color conversion film of the present invention is a resin that is polymerized or cross-linked by radical species or ion species generated by optically treating a photo-setting resin or optically and thermally treating photo-and-thermo-setting resin to become insoluble and unmeltable. The photo-setting or photo-and-thermo-setting resin favorably is soluble to organic solvent or alkaline solution before curing for facilitating patterning of the fluorescent color conversion film. The matrix resin that may be used in the present invention includes the following specific materials, for example.

(1) A material obtained by polymerization of photo-radicals or thermo-radicals which are generated by optical or thermal treatment of a film composed of acrylic multifunctional monomer or oligomer including a multiple of acryloyl groups or methacryloyl groups and a photo- or thermo-polymerization initiator.

(2) A material crosslinked by optically or thermally treating a composition of polyvinylcinnamate and a sensitizer.

(3) A material obtained by crosslinking olefin and nitrene, the latter is generated by optically or thermally treating a film composed of direct chain olefin or cyclic olefin and bisazide.

(4) A material polymerized by acid (cation) generation in optically or thermally treating a film composed of epoxy-group-containing monomer and acid-generating agent.

The photo-setting or photo-and-thermo-setting resin of above (1), in particular, facilitates high precision patterning and is favorable in reliability such as resistance to a solvent and resistance to heat.

High Boiling Point Solvent

A high boiling point solvent used in the invention is an organic liquid having a boiling point of 150° C. or more. This is required for the liquid not to evaporate at the fabrication temperature of the fluorescent color conversion film. Further, a high boiling point solvent used in the present invention preferably has a vapor pressure of 5 mmHg or lower at 20° C. This is because a chemical compound with high vapor pressure, for example iodine, is known to vaporize or sublimate even at temperature below boiling point in thermodynamic equilibrium. A high boiling point solvent used in the invention favorably has a large dielectric constant, and preferably contains one or more hydroxyl group or carbonyl group, or both groups. High boiling point solvents to be used in the invention include the substances represented by Formulas (I-1) to (I-12) listed below, but are not limited to them.

(I-1)

(I-2)

(I-3)

(I-4)

(I-5)

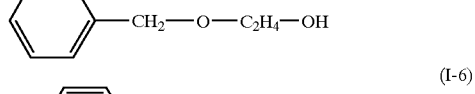

(I-6)

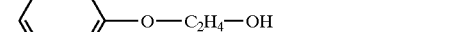

(I-7)

(I-8)

(I-9)

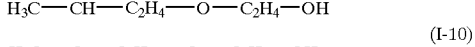

(I-10)

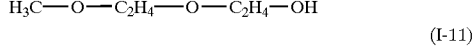

(I-11)

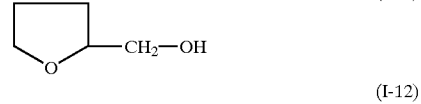

(I-12)

These high boiling point solvents can be easily synthesized by a general method or simply obtained from commercial suppliers. These solvents may be used alone or by mixing two or more solvents together.

The high boiling point solvent in the invention is contained in the fluorescent color conversion film in the amount of from 0.00001 to 50 weight %, preferably 0.00001 to 1 weight % with respect to the weight of the conversion film.

2. Fluorescent Color Conversion Filter

A fluorescent color conversion filter of the invention comprises at least the above-described fluorescent color conversion film and a transparent substrate. Further, a fluorescent color conversion filter of the invention may comprise a color filter or filters if necessary.

FIG. 1 is a schematic cross sectional view showing a structure of a fluorescent color conversion filter. FIG. 1 schematically illustrates a portion corresponding to one pixel of a fluorescent color conversion filter that has a multiple of pixels for use in multi- or full-colored display.

As shown in FIG. 1, the fluorescent color conversion filter comprises a transparent substrate 5, a red filter layer 2 laminated on transparent substrate 5, and a fluorescent color conversion film 1 laminated on red filter layer 2. These layers are disposed in a predetermined plane pattern. Fluorescent color conversion film 1 comprises one or more organic fluorescent dyes, one or more high boiling point solvents including, but not limited to those represented by Formulas (I-1) to (I-12), and matrix resin obtained by hardening photo-setting resin or photo-and-thermo-setting resin. The red filter layer 2 transmits red light converted by the fluorescent color conversion film 1 and cuts off light in other colors.

A green filter layer 3 and a blue filter layer 4 are also formed on transparent substrate 5 in each predetermined pattern. Each of these filters transmits only green light or blue light out of the light emitted from the organic light-emitting element and outputs light in each color. A protective film 6 and an insulative inorganic oxide film 7 cover the filter layers and constitute together a fluorescent color conversion filter.

While the fluorescent color conversion filter illustrated in FIG. 1 emits green light using only green filter layer 3, a fluorescent color conversion film for green color may be provided on the green filter layer 3, if required.

It is desired that the substrate suitably used in the invention is transparent to visible light and dimensions thereof are stable. The materials appropriate for the substrate include glass, quartz, sapphire and polymer such as polyimide, but are not limited to them.

The fluorescent color conversion film of the present invention may be aid formed by coating on an appropriate substrate according to a method known in the art, such as spin-coating, casting or dip-coating. The coating is performed using a solution or a dispersion liquid containing organic fluorescent dye, high boiling point solvent and a component for forming matrix resin. Thickness of the fluorescent color conversion film is preferably in the range from 0.1 to 50 $\mu$m, more preferably from 1.0 to 10$\mu$m, depending on content of the organic fluorescent dye.

Patterning of the fluorescent color conversion film is preferably conducted by means of photolithography.

Color filters that may be employed in the fluorescent color conversion filter of the invention are used for adjusting hues of output light of an organic light-emitting device of the invention. For adjusting a hue of the light which has undergone wavelength conversion by the fluorescent color conversion film, a color filter is disposed between the color conversion film and the substrate. A color filter may be disposed in the portion without fluorescent color conversion film on the substrate, and a hue of the light from the light-emitting element can be adjusted. A color filter can be fabricated employing commonly used or commercially available material.

The fluorescent color conversion filter may further comprise a protective layer and an insulative oxide layer, as required.

A protective layer which may be comprised by the fluorescent color conversion filter of the invention is favorably formed covering the fluorescent color conversion film and protects the conversion film from oxygen and other harmful material. The surface of the protective layer in the opposite side to the substrate is favorably flat because an organic light-emitting element is formed on the surface. The protective layer may be formed using commonly used resin and employing commonly practiced coating method. The protective layer preferably is transparent to visible light.

An insulative inorganic oxide film that may be comprised by the fluorescent color conversion filter of the invention is disposed preferably on a protective layer having a flat surface. The insulative inorganic oxide film can be formed by a commonly used method, such as, vacuum deposition, sputtering, or CVD. The oxide film also preferably is transparent to visible light. $SiO_2$ is a favorable oxide film material.

A fluorescent color conversion filter of the present invention also may be used as a backlight when the conversion filter comprises at least a transparent substrate, a color filter on the substrate as required, and a fluorescent color conversion film uniformly formed on the whole surface of the substrate. Alternatively, a fluorescent color conversion filter may be used as a display device when the conversion filter comprises at least a transparent substrate, a color conversion film(s) formed only at desired portion on the substrate.

3. Organic Light-emitting Device

An organic light-emitting device of the present invention comprises the fluorescent color conversion filter described above and an organic light-emitting element. The fluorescent color conversion filter absorbs light in a near ultraviolet to visible light region, preferably in a blue to blue-green region, emitted from the organic light-emitting element and emits visible light of different wavelength.

The organic light-emitting element has a structure in which an organic light-emitting layer is sandwiched between a pair of electrodes and, as required, a hole injection layer and an electron injection layer are interposed. The following layer constructions may be applied:

(1) anode/organic light-emitting layer/cathode;
(2) anode/hole injection layer/organic light-emitting layer/ cathode;
(3) anode/organic light-emitting layer/electron injection layer/cathode;
(4) anode/hole injection layer/organic light-emitting layer / electron injection layer/cathode; amd
(5) anode/hole injection layer/hole transport layer/ organic light-emitting layer/electron injection layer/cathode.

In the above structure, at least one of the anode and cathode is favorably transparent to the wavelength range of the light emitted from the organic light-emitting element, which radiates light through the transparent electrode into the fluorescent color conversion film. It is known in the art that obtaining a transparent anode is easier. A transparent anode is preferably employed also in the present invention.

Material of each of the above layers may be selected from known substances. For the material of the organic light-emitting layer to obtain blue to green light, a fluorescent brightening agent such as benzothiazole, benzimidazole or benzoxazole, a metal chelate oxonium compound, a styrylbenzene compound, or an aromatic dimethylidyne compound may be favorably used.

Figure 2:
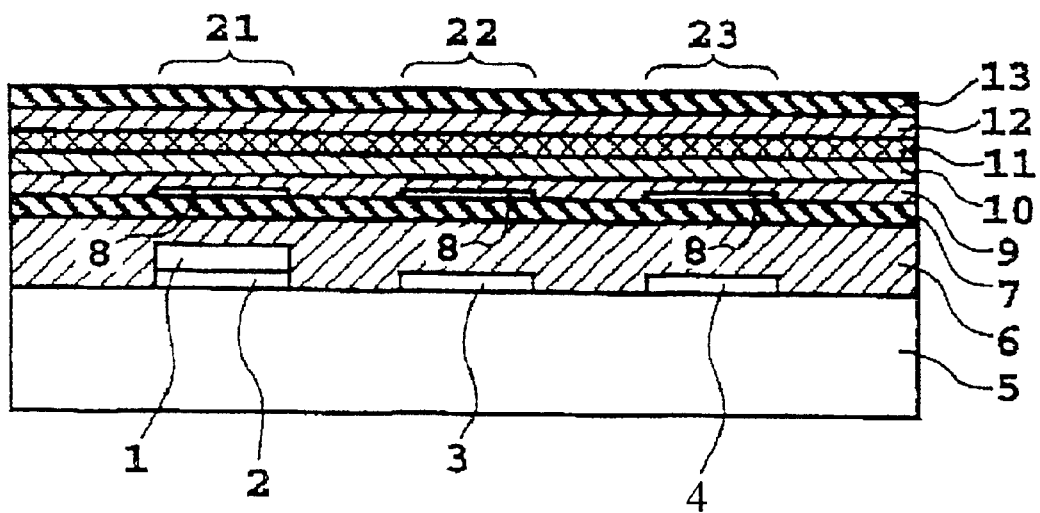
FIG. 2 is a schematic cross sectional view illustrating an embodiment of an organic light-emitting device of the invention.

FIG. 2 is a schematic cross sectional view of the whole structure of an organic light-emitting device. FIG. 2 schematically illustrates a portion corresponding to one pixel of an organic light-emitting device that has a multiple of pixels for use in multi- or full-colored display.

An organic light-emitting element is formed on the fluorescent color conversion filter, as shown in FIG. 2. The organic light-emitting element comprises an anode 8 composed of transparent electrodes of ITO, for example, patterned on insulative inorganic oxide film 7. A hole injection layer 9 covers anode 8. A hole transport layer 10 is on hole injection layer 9. An organic light-emitting layer 11 is on hole transport layer 10. An electron injection layer 12 is on organic light-emitting layer 1. A cathode 13, composed of metal electrodes, is patterned on electron injection layer 12.

The patterns of anode 8 and cathode 13 in the present invention may be formed in each set of parallel stripes and the two sets of stripes are disposed orthogonal with each other. In that disposition, the organic light-emitting device of the invention is matrix driven. That is, when selected stripes of anode 8 and selected stripes of cathode 13 are electrically charged organic light-emitting layer 11 emits light at the positions where the charged stripes cross each other. Therefore, only the points in the light-emitting layer where a specific filter layer or a specific combined layer of a filter and a fluorescent color conversion film are disposed can be lit by charging a selected set of anode stripes and a selected set of cathode stripes. The light from the selected points transmits through each of the filter layers or the combined layers of a filter and a fluorescent color conversion film and each of the selected colors is output through transparent substrate 5. For example, when red light emitting portion 21, which corresponds to fluorescent color conversion film 1, is lit, the light is converted to red light in fluorescent conversion film 1, goes through red filter layer 2 and transparent substrate 5, and is output as a red light. In case when green light emitting portion 22, which corresponds to the green filter layer 3, is lit, the light after transmission through the green filter layer changes to light including only green component and is output through transparent substrate 5. Similarly, if the blue light emitting portion 23, which corresponds to the blue filter layer 4, is lit, the light after transmission through the blue filter layer changes to light including only blue component and is output through transparent substrate 5.

Alternatively, in an invented organic light-emitting device, anode 8 may be a uniform flat electrode, and cathode 13 may be patterned corresponding to the pixel array. In that construction so-called active matrix drive is possible by providing switching elements corresponding to the pixel array.

Alternatively, both of the anode and cathode may be formed totally uniform in an organic light-emitting device of the invention. Such a device can be used as a backlight.

EXAMPLES

Example 1

The filter portion illustrated in FIG. 1 is fabricated by the process described below.

Fabrication of Color Filter Layers

A transparent substrate 5 of corning glass (143×112×1.1 mm) was prepared. Color filter red (available under the trade name Colormosaic CR-7001 from Fuji Film Olin Co., Ltd.) was coated by means of spin-coating on the substrate, followed by patterning by photolithography, to obtain a red filter layer having a stripe pattern of 1 $\mu$m thickness, 0.104 mm width and 0.226 mm gap.

Similarly, each of color filter blue (available under the trade name Colormosaic CB-7001 from Fuji Film Olin Co., Ltd.) and color filter green (available under the trade name Colormosaic CG-7001 from Fuji Film Olin Co., Ltd.) was coated by means of spin-coating on the substrate, followed by patterning by photolithography, to obtain each of a blue filter layer 4 and a green filter layer 3 each having a stripe pattern of 1 $\mu$m thickness, 0.104 mm width and 0.226 mm gap.

Fabrication of a Fluorescent Color Conversion Film

As the organic fluorescent dyes, 0.6 parts by weight of coumarin 6, 0.3 parts by weight of rhodamine 6G and 0.3 parts by weight of basic violet 11 were used. The mixture of the dyes and 10 parts by weight of diethylene glycol, a high boiling point solvent represented by formula (I-1), were dissolved in 50 parts by weight of propylene glycol monoethyl acetate (PGMEA). To the resulting solution was added and dissolved 100 parts by weight of a transparent photopolymerizing resin, V-259PA/P5 (a trade name) from Nippon Steel Chemical Co. Ltd. to obtain a coating solution. The coating solution was coated on the surface of the filter layers by spin-coating followed by baking in: an oven at 90° C. to obtain a fluorescent color conversion film. Polyvinylalcohol was coated on the fluorescent color conversion film by spin-coating and dried to form an oxygen isolating film (not shown). The obtained laminate was exposed through a mask using an exposure apparatus equipped with a light source of a high pressure mercury lamp to be patterned with stripes of 0.104 mm width and 0.226 mm gap, and washed by pure water, followed by development with alkaline aqueous solution to form a fluorescent color conversion film 1 with a stripe pattern on the red filter layer 2. Then, the resulted article was baked in an oven at 160° C. to obtain a fluorescent color conversion filter of maximum thickness 7 $\mu$m including filter layers 2, 3 and 4 for three colors of 1 $\mu$m thick and a fluorescent conversion filter layer 1 of 6 $\mu$m thick on the red filter layer.

UV hardening type resin, which is epoxy modified acrylate, was coated on the thus obtained fluorescent color conversion filter by spin-coating, and exposed by a high pressure mercury lamp to form a protective layer 6. Protective layer 6 had a thickness of 3 $\mu$m above the color conversion film and the top surface thereof was flat. The pattern of fluorescent color conversion filter 1 was not distorted. Heating test at 100° C. was conducted, and any distortion of fluorescent color conversion filter 1 or protective layer 6 was not observed. An insulative inorganic oxide film 7 was formed on the whole surface of the protective layer by depositing 300 nm of $SiO_2$ film by means of sputtering.

Fabrication of an Organic Light-emitting Device

On the fluorescent color conversion filter fabricated as described above, an organic light-emitting element was formed having a six-layer structure of anode 8/hole injection layer 9 hole transport layer 10/organic light-emitting layer 11/electron injection layer 12 cathode 13, as shown in FIG. 2.

First, a film for transparent electrodes (ITO) was formed by a sputtering method on the whole surface of insulative inorganic oxide film 7, which is an outermost layer of the fluorescent color conversion filter. Then, photoresist (available under the trade name OFRP-800 from Tokyo Ohka Kogyo Co., Ltd.) was coated on the ITO, followed by patterning by means of photolithography to obtain anode 8 constituting patterns of stripes disposed at each of the light-emitting portions for red 21, green 22, and blue 23, the stripes having a width of 0.094 mm, a gap of 0.016 mm and a film thickness of 100 nm.

After that, the resulting substrate having the anode was installed in a resistance-heating evaporation chamber, and hole injection layer 9, hole transport layer 10, organic light-emitting layer 11 and electron injection layer 12 were, successively deposited in the same chamber holding a vacuum. Table 1 shows the substances and their structural formulas used in these layers. The pressure in the evaporation chamber during deposition process was $1 \times 10^{-4}$ Pa. Hole injection layer 9 was formed by depositing 100 nm of Cu phthalocyanine (CuPc). Hole transport layer 10 was formed by depositing 20 nm of 4,4'-bis[N-(1-naphthyl)-N-phenylamino] biphenyl (α-NPD). Organic light-emitting layer 11 was formed by depositing 30 nm of 4,4'-bis(2,2'-diphenylvinyl) biphenyl (DPVBi). Electron injection layer 12 was formed by depositing 20 nm of tris(8-quinolinolato) aluminum (Alq).

TABLE 1

| Layer | Substance | Structural Formula |
| --- | --- | --- |
| Hole Injection Layer 9 | Copper phthalocyanine | 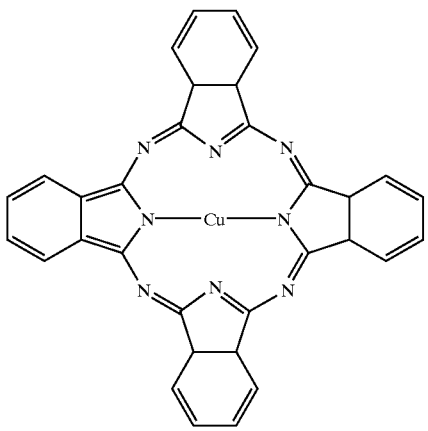 |
| Hole Transport Layer 10 | 4,4'-bis[N-(1-naphthyl)-N-phenylamino]-biphenyl | 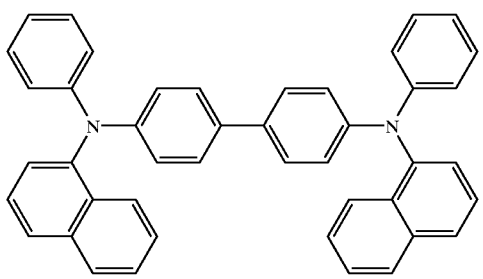 |
| Light-Emitting Layer 11 | 4,4'-bis(2,2-diphenylvinyl)biphenyl | 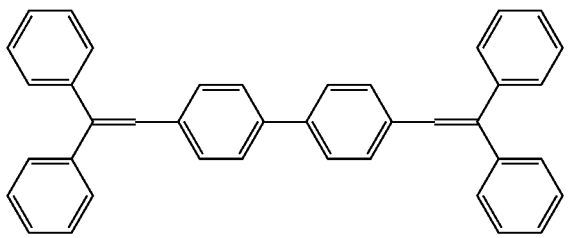 |
| Electron Injection Layer 12 | tris(8-quinolinolato)aluminium | 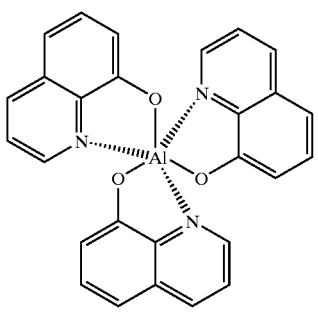 |

Then, transparent substrate 5 with the laminate thereon was taken out from the evaporation chamber. After being attached a mask for patterning stripes of cathode orthogonally arranged with respect to lines of anode (ITO), the substrate was again installed into the.resistance-heating evaporation chamber to obtain a cathode having the pattern of stripes each having a width of 0.30 mm and a gap of 0.03 mm. The cathode was formed of a Mg-Ag (weight ratio 10:1) layer having a thickness of 200 nm.

Thus obtained organic light-emitting device was sealed with a sealing glass plate (not shown) and UV-hardening adhesive under a dry nitrogen atmosphere in a glove box.

The organic light-emitting element in the organic light-emitting device fabricated as described above emits blue-green light with wavelength in the range of 430 to 550 nm.

Example 2

A fluorescent color conversion filter of Example 2 was fabricated repeating the same process as in Example 1 except that 10 parts by weight of diethylene glycol of Formula (I-1) of Example 1 was replaced by 10 parts by weight of diethylene glycol monomethyl ether of Formula (I-2), and an organic light-emitting device of Example 2 equipped with thus fabricated fluorescent color conversion filter was fabricated.

Example 3

A fluorescent color conversion filter of Example 3 was fabricated repeating the same process as in Example 1 except that 10 parts by weight of diethylene glycol of Formula (I-1) of Example 1 was replaced by 10 parts by weight of diethylene glycol monoethyl ether of Formula (I-3), and an organic light-emitting device of Example 3 equipped with thus fabricated fluorescent color conversion filter was fabricated.

Example 4

A fluorescent color conversion filter of Example 4 was fabricated repeating the same process as in Example 1 except that 10 parts by weight of diethylene glycol of Formula (I-1) of Example 1 was replaced by 10 parts by weight of 2-benzyloxyethanol of Formula (I-5), and an organic light-emitting device of Example 4 equipped with thus fabricated fluorescent color conversion filter was fabricated.

Example 5

A fluorescent color conversion filter of Example 5 was fabricated repeating the same process as in Example 1 except that 10 parts by weight of diethylene glycol of Formula (I-1) of Example 1 was replaced by: 10 parts by weight of diacetone alcohol of Formula (I-12), and an organic light-emitting device of Example 5 equipped with thus fabricated fluorescent color conversion filter was fabricated.

Comparative Example 1

A fluorescent color conversion filter of Comparative Example 1 was fabricated repeating the same process as in Example 1 except that 10 parts by weight of diethylene glycol of Formula (I-1) of Example 1 was not used, and an organic light-emitting device of Comparative Example 1 equipped with thus fabricated fluorescent color conversion filter was fabricated.

Comparative Example 2

A fluorescent color conversion filter of Comparative Example 2 was fabricated repeating the same process as in Example 1 except that 10 parts by weight of diethylene glycol of Formula (I-1) of Example 1 was replaced by 10 parts by weight of acetone, and an organic light-emitting device of Comparative Example 2 equipped with thus fabricated fluorescent color conversion filter was fabricated.

Comparative

Example 3

A fluorescent color conversion filter of Comparative Example 3 was fabricated repeating the same process as in Example 1 except that 10 parts by weight of diethylene glycol of Formula (I-1) of Example 1 was replaced by 10 parts by weight of methanol, and an organic light-emitting device of Comparative Example 3 equipped with thus fabricated fluorescent color conversion filter was fabricated.

Evaluation of Examples 1 through 5 and Comparative Examples 1 through 3

The organic light-emitting devices of Examples 1 through 5 and Comparative Examples 1 through 3 were evaluated on the red light emitting portion of each of the organic light-emitting devices. The results are summarized in Table 2. The methods and results of the evaluations of the items in Table 2 are described in the followings.

| | high boiling-point solvent | CIE chromaticity coordinate | | relative conversion efficiency |
|---|---|---|---|---|
| | | X | Y | |
| Example 1 | diethylene glycol | 0.65 | 0.34 | 1 |
| Example 2 | diethylene glycol monomethyl ether | 0.64 | 0.33 | 1.05 |
| Example 3 | diethylene glycol monoethyl ether | 0.65 | 0.34 | 1.02 |
| Example 4 | 2-benzyloxyethanol | 0.65 | 0.33 | 1.01 |
| Example 5 | diactetone alcohol | 0.65 | 0.33 | 0.98 |
| Comp. Ex. 1 | none | 0.61 | 0.36 | 0.88 |
| Comp. Ex. 2 | acetone | 0.60 | 0.36 | 0.87 |
| Comp. Ex. 3 | methanol | 0.62 | 0.35 | 0.89 |

CIE Chromaticity Coordinate

CIE chromaticity coordinate was measured with "MCPD-1000" (a trade name) manufactured by Ohtsuka Denshi Co., Ltd.

Relative Conversion Efficiency

Relative conversion efficiency is defined as brightness of a sample of an organic light-emitting device lit by applying a standard voltage relative to brightness of Example 1 lit by the standard voltage. The standard voltage is determined as the voltage that brings about brightness of 50 cd/m$^2$ with the organic light-emitting device of Example 1.

Clearly, red light emission with high color purity and high relative conversion efficiency were achieved in Examples 1 through 5 where the high boiling point solvents with boiling points of 150° C. or higher were used. In contrast, lower red color purity and degraded relative conversion efficiency resulted with Comparative Example 1 where no high boiling point solvent was added and with Comparative Examples 2 and 3 where acetone or methanol having boiling point lower than 150° C. was added.

Effect of the Invention

As explained in the foregoing, the present invention provides a fluorescent color conversion film which absorbs light in a near ultraviolet to visible light region from a light-emitting element and converts to visible light with different wavelength, for example, red:light. The fluorescent color conversion film of the invention comprises a high boiling point solvent(s) to prevent lowering of fluorescent quantum yield, bringing about excellent color conversion characteristics. By employing such a fluorescent color conversion film, a fluorescent color conversion filter capable of highly precise patterning can be easily obtained with low cost. In addition, an organic light-emitting device equipped with such a fluorescent color conversion filter may be suitably applied to commercial-oriented and industry-used display apparatuses, such as a self-lightening multi-colored or full-colored display, a display panel, and a backlight. Moreover, a full-colored display device with organic light-emitting elements capable of low voltage driving can be manufactured by equipment of the fluorescent color conversion filter of the invention.

Having described preferred embodiments of the invention with reference to the accompanying drawings, it is to be understood that the invention is not limited to those precise embodiments, and that various changes and modifications may be effected therein by one skilled in the art without departing from the scope or spirit of the invention as defined in the appended claims.

What is claimed is:

1. A fluorescent color conversion film, comprising:
   at least one organic fluorescent dye which absorbs light in a near ultraviolet to visible light region and emits visible light of a different wavelength;
   at least one matrix resin bearing said at least one organic fluorescent dye; and
   at least one solvent having a boiling point of at least 150° C. and a vapor pressure of not more than 5 mmHg at a temperature of 20° C.,
   wherein said at least one solvent does not evaporate during fabrication of said fluorescent color conversion film.

2. The fluorescent color conversion film as claimed in claim 1, wherein said at least one solvent is contained in an amount from about 0.00001 to about 50 weight % with respect to the weight of said fluorescent color conversion film.

3. A fluorescent color conversion filter, comprising:
   a fluorescent color conversion film;
   said fluorescent color conversion film including at least one organic fluorescent dye which absorbs light in a near ultraviolet to visible light region and emits visible light of different wavelength, at least one matrix resin bearing said at least one organic fluorescent dye, and at least one solvent having a boiling point of at least 150° C. and a vapor pressure of not more than 5 mmHg at a temperature of 20° C.,
   wherein said at least one solvent does not evaporate during fabrication of said fluorescent color conversion film; and
   a substrate.

4. The fluorescent color conversion filter as claimed in claim 3, wherein said at least one solvent is contained in an amount from about 0.00001 to about 50 weight % with respect to the weight of said fluorescent color conversion film.

5. An organic light-emitting device, comprising:
   a fluorescent color conversion film;
   said fluorescent color conversion film including at least one organic fluorescent dye which absorbs light in a near ultraviolet to visible light region and emits visible light of different wavelength, at least one matrix resin bearing said at least one organic fluorescent dye, and at least one solvent having a boiling point of at least 150° C. and a vapor pressure of not more than 5 mmHg at a temperature of 20° C.,
   wherein said at least one solvent does not evaporate during fabrication of said fluorescent color conversion film; and
   an organic light-emitting element.

6. The fluorescent color conversion film according to claim 2, wherein said at least one solvent is contained in an amount from about 0.00001 to about 1 weight % with respect to the weight of said fluorescent color conversion film.

7. The fluorescent color conversion film according to claim 4, wherein said at least one solvent is contained in an amount from about 0.00001 to about 1 weight % with respect to the weight of said fluorescent color conversion film.

8. An organic light-emitting device according to claim 5, wherein said at least one solvent is contained in an amount from about 0.00001 to about 1 weight % with respect to the weight of said fluorescent color conversion film.

* * * * *